(12) United States Patent
Wagner

(10) Patent No.: US 9,912,083 B2
(45) Date of Patent: Mar. 6, 2018

(54) HIGH SPEED PLUG

(71) Applicant: SENTINEL CONNECTOR SYSTEM INC., York, PA (US)

(72) Inventor: Justin S. Wagner, York, PA (US)

(73) Assignee: Sentinel Connector Systems, Inc., York, PA (US)

( * ) Notice: Subject to any disclaimer, the term of this patent is extended or adjusted under 35 U.S.C. 154(b) by 5 days.

(21) Appl. No.: 14/952,458

(22) Filed: Nov. 25, 2015

(65) Prior Publication Data

US 2017/0025799 A1  Jan. 26, 2017

Related U.S. Application Data

(60) Provisional application No. 62/195,027, filed on Jul. 21, 2015.

(51) Int. Cl.

| H01R 12/50 | (2011.01) |
| H01R 12/00 | (2006.01) |
| H01R 13/6581 | (2011.01) |
| H01R 13/66 | (2006.01) |
| H01R 43/00 | (2006.01) |
| H01R 43/20 | (2006.01) |

(Continued)

(52) U.S. Cl.
CPC .......... H01R 9/0785 (2013.01); H01R 12/50 (2013.01); H01R 13/6581 (2013.01); H01R 13/665 (2013.01); H01R 13/6658 (2013.01); H01R 43/00 (2013.01); H01R 43/20 (2013.01); H05K 1/0216 (2013.01); H01R 4/2416 (2013.01)

(58) Field of Classification Search
CPC A61B 1/00124; H01R 9/0785; H01R 9/0707; H01R 9/091; H01R 9/0721; H01R 9/0714; H01R 9/0742; H01R 9/0735; H01R 9/0728; H01R 9/0757; H01R 9/075; H01R 9/0771; H01R 9/0777; H01R 9/0764; H01R 9/0778; H01R 9/0729; H01R 9/09; H01R 9/092; H01R 9/093; H01R 9/095; H01R 9/096; H01R 9/097; H01R 9/098; H01R 9/11; H01R 9/22; H01R 12/50; H01R 12/51; H01R 12/515; H01R 12/52; H01R 12/523
See application file for complete search history.

(56) References Cited

U.S. PATENT DOCUMENTS

| 5,269,705 A | 12/1993 | Iannella et al. |
| 5,383,095 A * | 1/1995 | Korsunsky ......... H01R 23/6873 174/261 |
| 6,250,968 B1 | 6/2001 | Winings |

(Continued)

FOREIGN PATENT DOCUMENTS

JP  2003015902 A  1/2003

OTHER PUBLICATIONS

International Search Report and Written Opinion dated Dec. 28, 2015 filed in PCT/US2015/050599, 11 pgs.

*Primary Examiner* — Jeremy C Norris
(74) *Attorney, Agent, or Firm* — Vedder Price P.C.

(57) ABSTRACT

A communication plug including a substrate having a top surface, a bottom surface, opposing side surfaces and opposing end surfaces, a grounding plane in the substrate, a grounding strip on a side surface of the substrate in electrical communication with the grounding plane, where the grounding strip is electrically connected to the ground plane in the substrate.

14 Claims, 12 Drawing Sheets

(51) Int. Cl.
*H05K 1/02* (2006.01)
*H01R 4/24* (2018.01)

(56) References Cited

U.S. PATENT DOCUMENTS

| | | |
|---|---|---|
| 6,663,423 B2 | 12/2003 | Belopolsky et al. |
| 7,018,242 B2 | 3/2006 | Brown et al. |
| 7,252,554 B2 | 7/2007 | Caveney et al. |
| 7,357,683 B2 | 4/2008 | Caveney et al. |
| 7,364,470 B2 | 4/2008 | Hashim |
| 7,402,085 B2 | 7/2008 | Hammond, Jr. et al. |
| 7,452,246 B2 | 11/2008 | Caveney et al. |
| 7,544,088 B2 | 6/2009 | Caveney et al. |
| 7,601,034 B1 | 10/2009 | Aekins et al. |
| 7,618,296 B2 | 11/2009 | Caveney |
| 7,670,193 B2 | 3/2010 | Millette et al. |
| 7,736,195 B1 | 6/2010 | Poulsen et al. |
| 7,823,281 B2 | 11/2010 | Caveney et al. |
| 7,824,231 B2 | 11/2010 | Marti et al. |
| 7,837,513 B2 | 11/2010 | Millette et al. |
| 7,850,492 B1 | 12/2010 | Straka et al. |
| 7,857,667 B1 | 12/2010 | Wang |
| 7,874,879 B2 | 1/2011 | Caveney et al. |
| 7,905,753 B2 | 3/2011 | Siev et al. |
| 7,909,649 B2 | 3/2011 | Laroche |
| 7,914,345 B2 | 3/2011 | Bopp et al. |
| 7,967,645 B2 | 6/2011 | Marti et al. |
| 8,011,972 B2 | 9/2011 | Caveney et al. |
| 8,047,879 B2 | 11/2011 | Hashim |
| 8,052,483 B1 | 11/2011 | Straka et al. |
| 8,083,551 B2 | 12/2011 | Hetzer et al. |
| 8,262,415 B2 | 9/2012 | Caveney et al. |
| 8,287,317 B2 | 10/2012 | Straka et al. |
| 8,303,348 B2 | 11/2012 | Straka et al. |
| 8,435,083 B2 | 5/2013 | Hetzer et al. |
| 8,435,084 B2 | 5/2013 | Caveney et al. |
| 8,550,850 B2 | 10/2013 | Caveney et al. |
| 8,632,362 B2 | 1/2014 | Straka et al. |
| 8,632,367 B2 | 1/2014 | Caveney |
| 8,764,476 B1 | 7/2014 | Ma |
| 8,858,266 B2 | 10/2014 | Robinson |
| 2002/0191140 A1 | 12/2002 | Eguchi et al. |
| 2004/0116081 A1 | 6/2004 | Crudele et al. |
| 2005/0181676 A1 | 8/2005 | Caveney et al. |
| 2006/0121792 A1 | 6/2006 | Hashim |
| 2006/0160428 A1 | 7/2006 | Hashim |
| 2007/0015417 A1 | 1/2007 | Caveney et al. |
| 2007/0117469 A1 | 5/2007 | Caveney et al. |
| 2007/0178772 A1 | 8/2007 | Hashim et al. |
| 2007/0190863 A1 | 8/2007 | Caveney et al. |
| 2008/0020652 A1 | 1/2008 | Caveney et al. |
| 2008/0166925 A1 | 7/2008 | Caveney et al. |
| 2008/0207015 A1* | 8/2008 | Sueyoshi ............... H05K 3/308 439/75 |
| 2009/0242241 A1 | 10/2009 | Takahashi et al. |
| 2010/0041278 A1 | 2/2010 | Bopp et al. |
| 2011/0104933 A1 | 5/2011 | Straka et al. |
| 2012/0122352 A1 | 5/2012 | Caveney |
| 2012/0129404 A1 | 5/2012 | Caveney et al. |
| 2012/0164884 A1 | 6/2012 | Hetzer et al. |
| 2012/0184154 A1 | 7/2012 | Straka et al. |
| 2013/0210277 A1 | 8/2013 | Robinson |
| 2013/0288538 A1 | 10/2013 | Caveney et al. |
| 2014/0073196 A1 | 3/2014 | Hashim et al. |
| 2014/0154919 A1 | 6/2014 | Straka et al. |

* cited by examiner

HIGH SPEED PLUG

CROSS-REFERENCE TO RELATED APPLICATIONS

This application is a non-provisional patent application that claims the benefit of and the priority from U.S. Provisional Patent Application No. 62/195,027, filed Jul. 21, 2015, titled HIGH SPEED PLUG.

BACKGROUND OF THE INVENTION

Current network plug technology limits the amount of data that can be transmitted from a cable connected to one portion of a plug to a device connected to a second portion of the plug. As data communication speeds increase, the need to provide a properly grounded connection between two points becomes critical.

Currently, grounding of network connections requires manual manipulation of a grounding wire to a plug. Often, this manual manipulation results in an improper ground connection that may result in loss of data transmission due to transient signals. Further, manual manipulation of the plug requires additional man hours to terminate and test each connection, thereby increasing costs of installation of network connection points.

A need exists for a plug that creates a proper ground connection without manual manipulation of the plug.

BRIEF SUMMARY OF THE INVENTION

One embodiment of the present disclosure includes a communication plug that may include a substrate having a top surface, a bottom surface, opposing side surfaces and opposing end surfaces, a grounding plane in the substrate, a grounding strip on a side surface of the substrate in electrical communication with the grounding plane wherein the grounding strip is electrically connected to the ground plane in the substrate.

In another embodiment, the plug may include a plurality of openings in the sides of the substrate.

In another embodiment, the plug may include a plurality of pin vias in one of the substrate.

In another embodiment, the plug may include a plurality of wire vias in the substrate, the wire vias being located adjacent to each opening.

In another embodiment, the plug may include a connection pad formed on the surface of the substrate around each wire via.

In another embodiment, the connection pad may include a circular portion extending around the periphery of the wire vias and a triangular portion extending from the circular portion towards an opening in the substrate.

In another embodiment, the plug may include a plurality of traces on the top surface of the substrate, each trace extending from a pin via to a connection pad.

In another embodiment, the plug may include at least two of the plurality of traces are on the bottom of the substrate.

In another embodiment, the plug may include a securing unit having a portion inserted into the wire via and a portion covering the connection pad.

In another embodiment, the plug may include a second grounding adjacent to the grounding plane in the substrate.

Another embodiment of the present disclosure may include a method of forming a communication plug including the steps of forming a bottom layer of a substrate, forming a sub layer on the bottom layer, the sub layer including a first grounding plane, forming a middle layer on the grounding layer, the middle layer having a grounding plane, forming a top layer on the substrate, forming pin vias in the substrate, forming openings in opposing sides of the substrate, forming wire vias adjacent to each opening in the substrate, forming a grounding surface on opposite sides of the substrate on the top layer and bottom layer of the substrate, the grounding surface being in electrical communication with the first grounding layer and the second grounding layer, and forming traces on the top layer and bottom layer between the wire vias and pin vias.

In another embodiment, the method may include the step of inserting a pin in each pin via.

In another embodiment, the method may include the step of forming a connection pad around each wire via.

In another embodiment, the method may include the step of forming the connection pad includes the step of forming a circular portion extending around the periphery of the wire vias and forming a triangular portion extending from the circular portion towards an opening in the substrate.

In another embodiment, the method may include the step of forming the traces includes forming the traces from each pin via to a corresponding connection pad.

In another embodiment, the method may include the step of inserting the substrate into a plug housing, the plug housing having openings in side surface so of the housing that correspond to the openings formed in the substrate.

In another embodiment, the method of forming the traces may include forming a first group of traces on the top surface of the substrate and a second group of traces on the bottom surface of the substrate.

In another embodiment, the method may include the step of inserting a pin on a from portion of a securing into each wire via and positioning a lower portion of the securing unit over the connection pad corresponding to the wire via accepting the pin.

In another embodiment, the housing may include a plurality of openings over the pin vias, each opening being sized to accommodate a pin.

In another embodiment, each securing unit may secure one wire in electrical communication with a connection pad.

BRIEF DESCRIPTION OF THE SEVERAL VIEWS OF THE DRAWING

Details of the present invention, including non-limiting benefits and advantages, will become more readily apparent to those of ordinary skill in the relevant art after reviewing the following detailed description and accompanying drawings, wherein.

DETAILED DESCRIPTION OF THE INVENTION

Figure 1A:
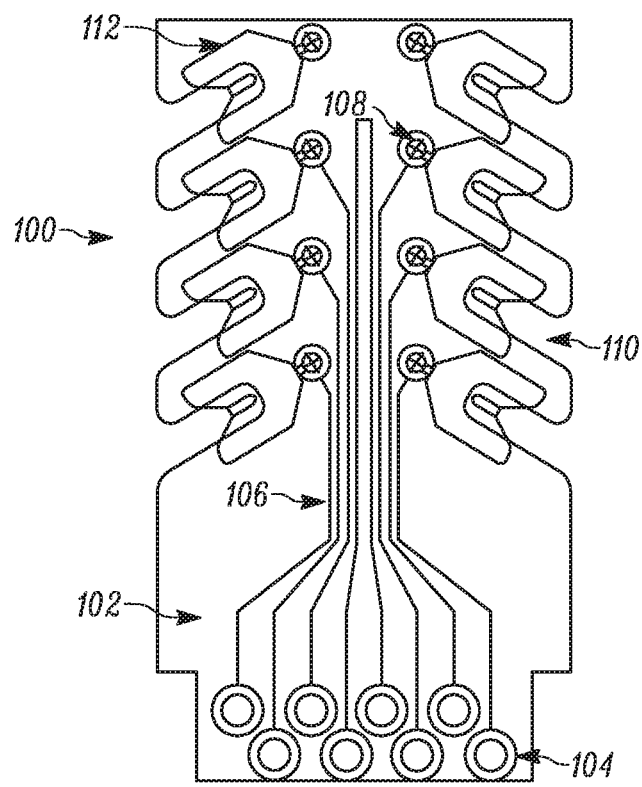
FIG. 1A depicts a high speed communication plug that is consistent with the present disclosure.

FIG. 1A depicts a high speed communication plug 100 that is consistent with the present disclosure. The plug 100 includes a substrate 102 having a first group of vias 104 through the substrate 102 with each via 104 being connected to a second via 108 by a trace 106. The trace 106 is formed on a top surface of the substrate 102 and is made of an electrically conductive material such as copper. A plurality of insulation displacement contacts ("IDC") 112 are positioned in the vias 108. The IDC 112 may be made of a metal including, but not limited to, copper. Each IDC 112 is positioned over an opening 110 in the substrate 102. Each IDC 112 and opening 110 is configured to accept a wire or cable. In one embodiment, the wire is a 24 gauge cable. In another embodiment, the wire is a 26 gauge wire. In another embodiment, the wire is a threaded wire. In another embodiment, the wire is a solid wire.

The openings 110 may be offset at an angle from the horizontal or may be perpendicular to the side surface of the substrate 102. In one embodiment, a group of openings 110 are offset and a group of openings 110 are not offset. In another embodiment, each opening 110 is offset. In another embodiment, the opening 110 is blind and does not exit the substrate 102. In another embodiment, each opening is perpendicular to the side of the substrate 102. In another embodiment, the IDC 112 includes a wire guide (not shown).

Figure 1B:
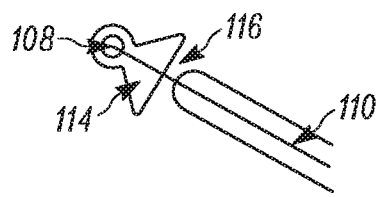
FIG. 1B depicts a close up view of the via and solder pad with the IDC removed.
Figure 1C:
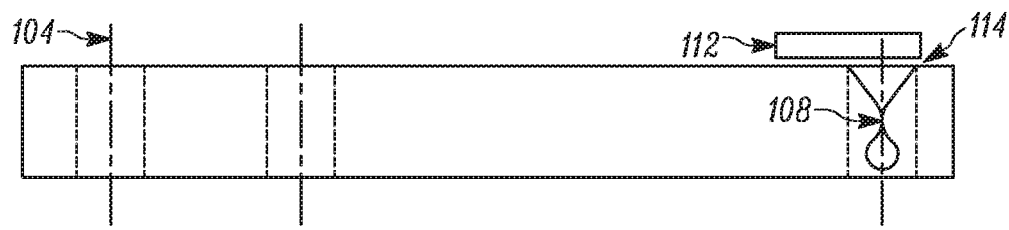
FIG. 1C depicts a side view of the plug including an IDC installed in a via.

FIG. 1B depicts a close up view of the via 108 and solder pad 114 with the IDC 112 removed. The solder pad 114 is formed on the top surface of the substrate 102 is and configured to secure an IDC 112 to the substrate 102 when an IDC 112 is inserted into a respective via 108. A portion of the solder pad 114 between the opening 110 and the via 108 is substantially triangular in shape. An area 116 on the substrate 102 between the opening 110 and the solder pad 14 is empty to allow for movement when a wire is inserted into the IDC 112. FIG. 1C depicts a side view of the plug 100 including an IDC 112 installed in a via 108. The IDC 112 is positioned on the solder pad 114 and in the via 108 such that the IDC 112 is parallel with the top surface of the substrate. By inserting the IDC 112 into the via and above the solder pad 114, the capacitance of the IDC 112 is reduced.

Figure 2:
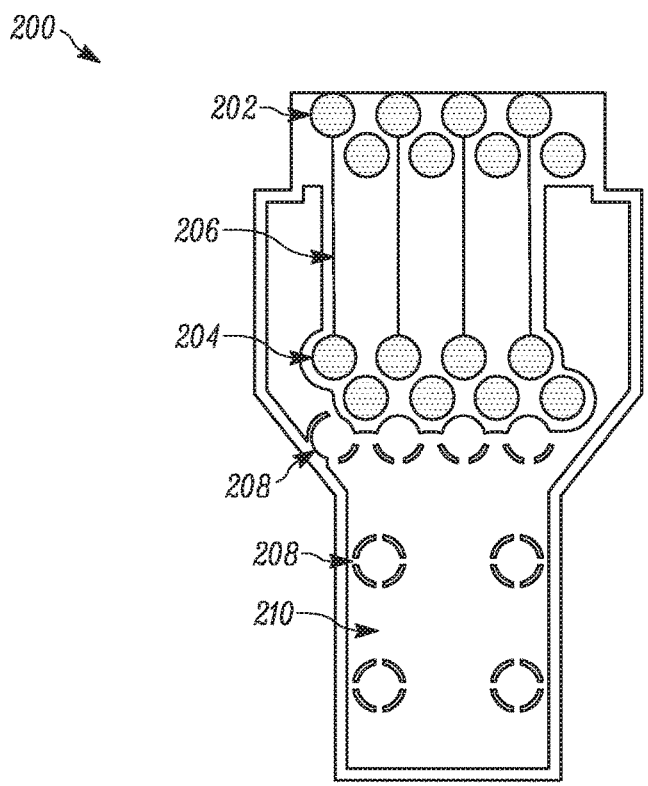
FIG. 2 depicts a top view of a bottom layer of a multi-layer high speed plug.
Figure 3:
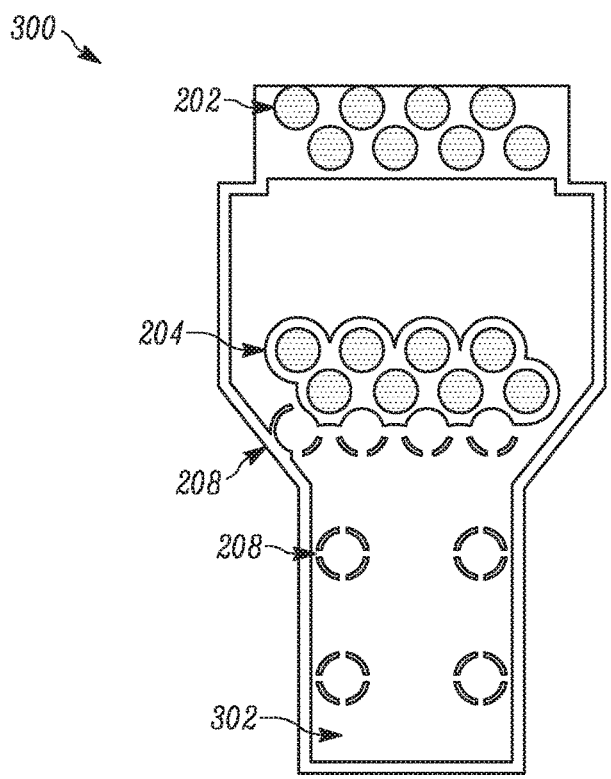
FIG. 3 depicts a top view of a second layer of a multi-layer high speed plug.
Figure 4:
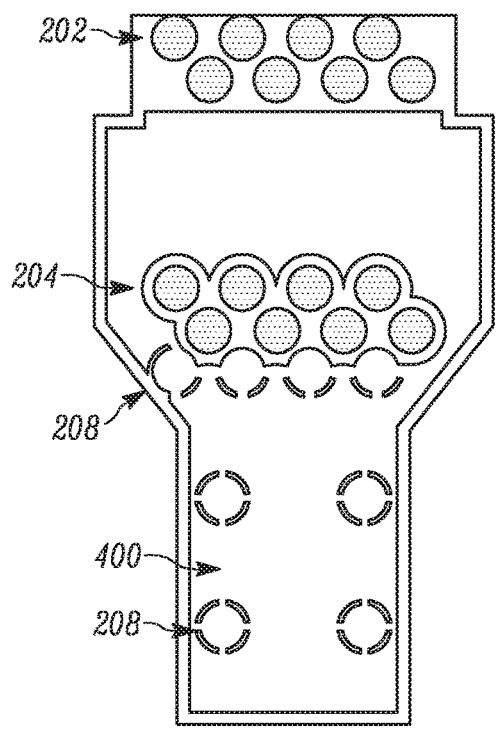
FIG. 4 depicts a top view of a third layer of a multi-layer high speed plug.

FIG. 2 depicts a top view of a bottom layer of a multi-layer high speed plug. The bottom layer includes 200 includes a first group of vias 202 and a second set of vias 204 with half of the first group of vias are connected by a trace 206 to a corresponding second via 204, and a grounding plane 208 and a plurality of grounding vias 210. FIG. 3 depicts a top view of a second layer of a multi-layer high speed plug. The second layer includes the first vias 202 and second vias 204 and a grounding plane 302. FIG. 4 depicts a top view of a third layer of a multi-layer high speed plug. The third layer includes the first vias 202 and second vias 204 and a grounding plane 402.

Figure 5:
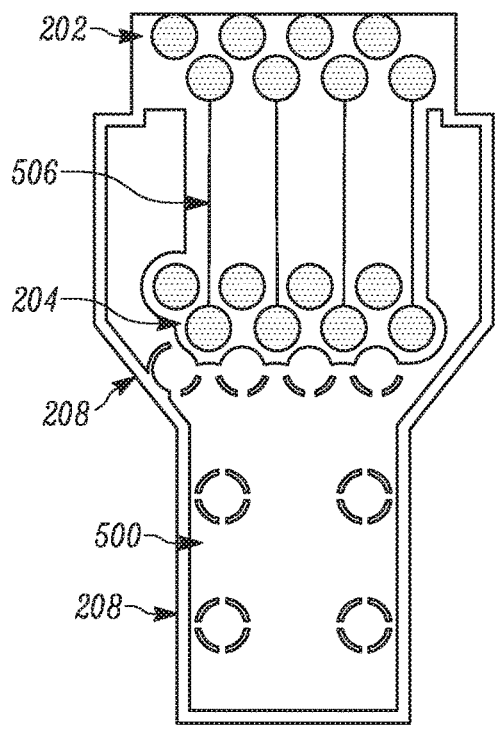
FIG. 5 depicts a top view of a upper layer of the multi-layer high speed plug.
Figure 6:
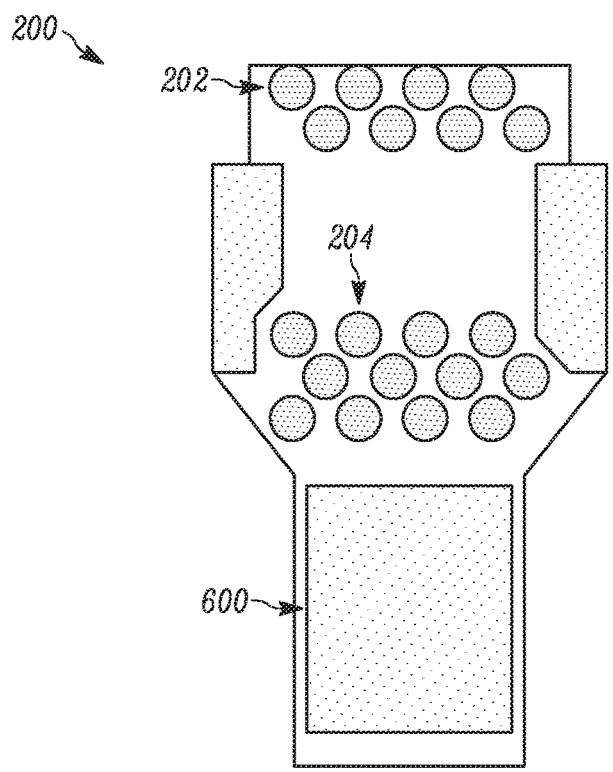
FIG. 6 depicts a top layer of the multi-layer high-speed plug.
Figure 7:
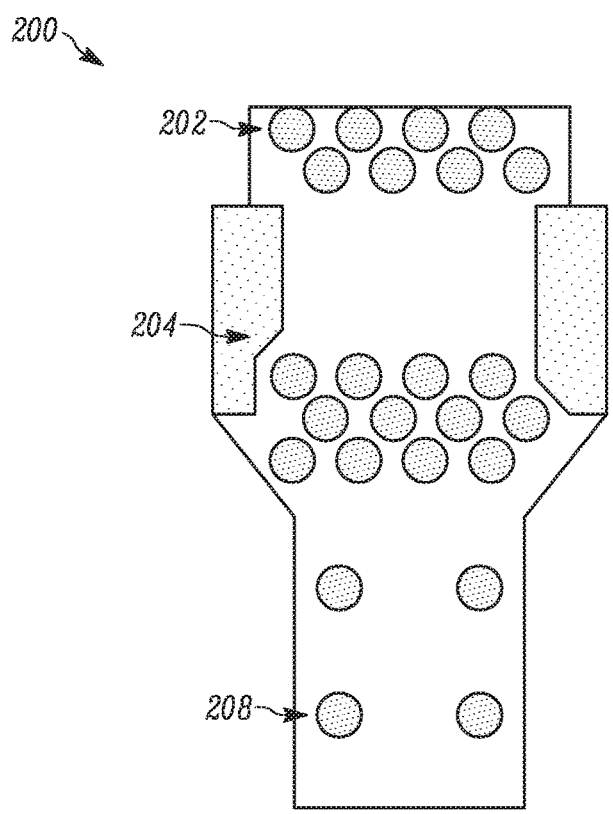
FIG. 7 discloses a top view of a lower layer of the multi-layer plug.

FIG. 5 depicts a top view of a upper layer of the multi-layer high speed plug. The upper layer includes the first vias 202 and second vias 204. The first vias 202 not connected to a second via 204 in the lower layer are connected via traces 506. A grounding plane 500 extends across the surface of the upper layer in the area of the grounding vias 210. FIG. 6 depicts a top layer of the multi-layer high-speed plug. The top layer includes the first vias 202 and second vias 206 and a grounding plane 600. FIG. 7 discloses a top view of a lower layer of the multi-layer plug. The top layer includes the first vias 202 and second vias 204 along with the grounding vias 208.

When assembled, the first vias 202 and second vias 204 extend through each layer of the multi-layer plug. The grounding vias 208 extend through each layer of the multi-layer plug electrically connecting the grounding planes in each layer.

Figure 8:
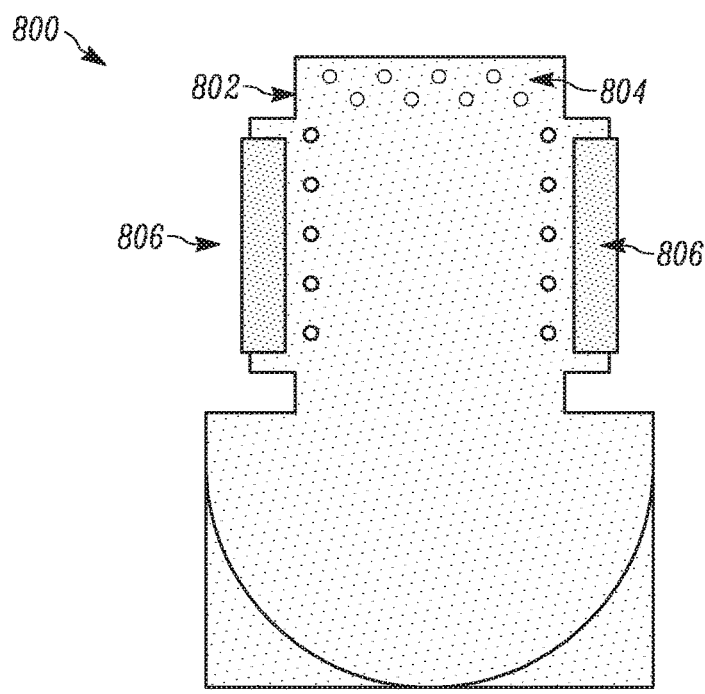
FIG. 8 depicts one embodiment of a plug.

FIG. 8 depicts one embodiment of a plug 800. A first group of vias 804 is formed through a substrate 802 with each first via 804 being connected to a second via (not shown) by a trace (not shown). Grounding strips 806 are formed on the sides of the substrate 802 between the first group of vias 804 and the second group of vias (not shown). The grounding strips 806 are electrically connected to at least one grounding plane in the substrate 802. The grounding strips 806 are formed on a side surface of the substrate 802 with the side surface being perpendicular to the top surface of the substrate 802. The grounding strips 806 may be formed of any conductive material including, but not limited to, gold or copper.

Figure 9:
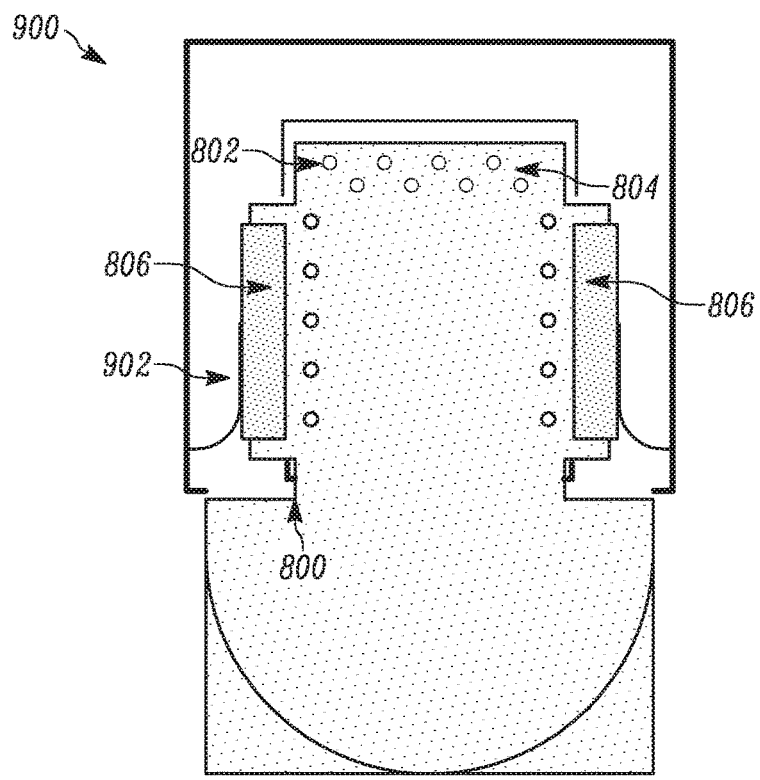
FIG. 9 depicts the plug of FIG. 8 inserted into a jack.

FIG. 9 depicts the plug 800 inserted into a jack 900. The jack 900 includes grounding planes 902. In one embodiment, the jack 900 is an RJ-45 jack and the plug 800 is an RJ-45 plug. The grounding planes 902 are positioned in the jack 900 such that each grounding plane conductively engages a respective grounding strip 806 on the plug 800. When the plug 800 is inserted into the jack 900, the grounding strips 806 and grounding planes 902 create a grounding connection between the jack 900, plug 800 and the circuit board (not shown) connected to the jack 900.

Figure 10:
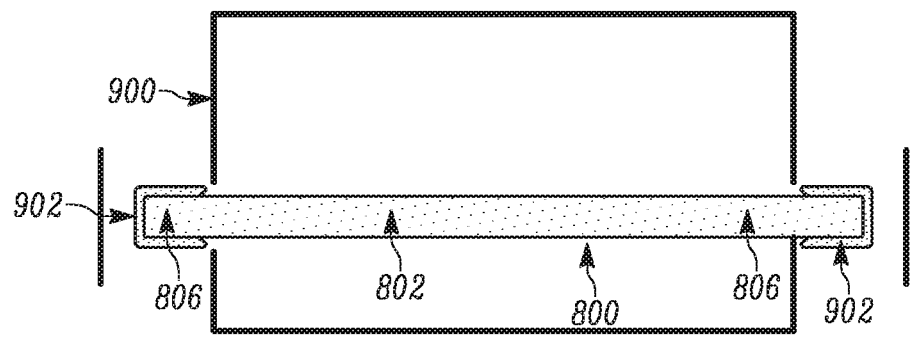
FIG. 10 depicts a front view of the plug of FIG. 8 engaging the jack.

FIG. 10 depicts a front view of the plug 800 engaging the jack 900. The grounding planes 902 are in contact with the grounding strips 806 when the plug is inserted into the jack. By forming the grounding strip 806 on the plug such that the grounding strip 806 is in contact with the grounding plane 902 of a jack 900 when the plug 800 engages the jack 900, manual manipulation of a grounding wire is not required, thereby reducing costs of installing the plug 800. Further, because the plug 800 is properly grounded to the jack 900, the performance of the plug 800 is improved.

Figure 11:
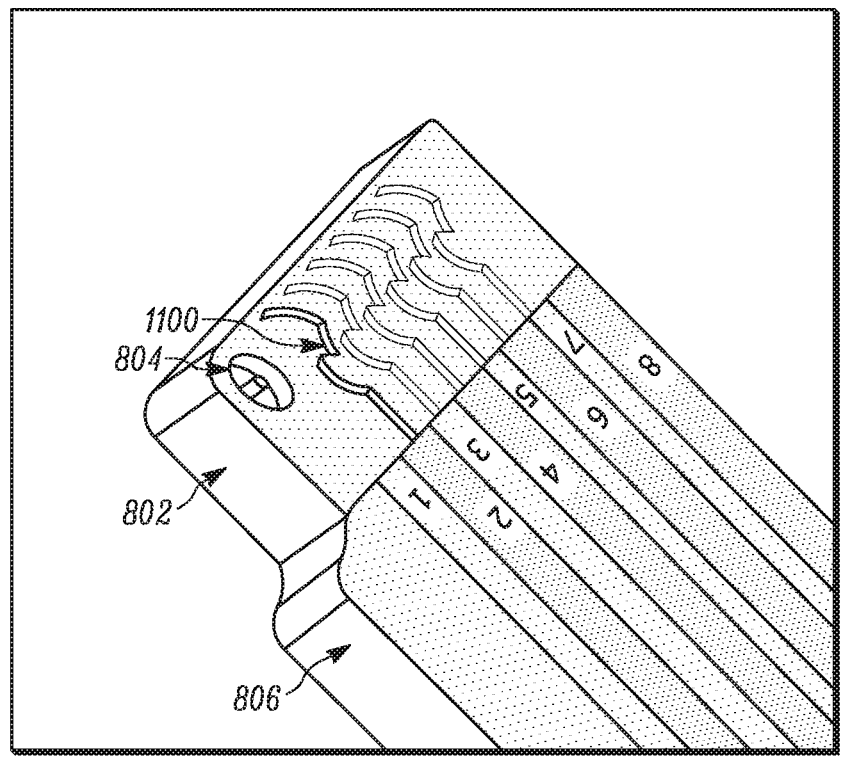
FIG. 11 depicts a grounding strip on the substrate of the plug of FIG. 8.
Figure 12:
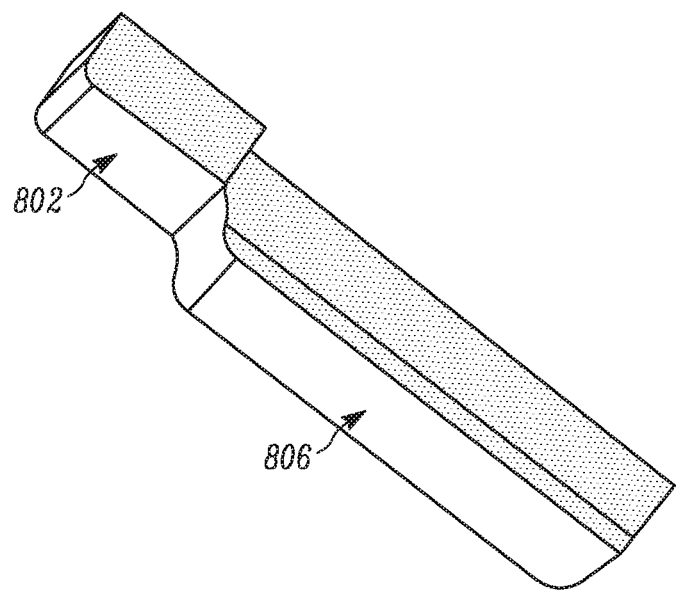
FIG. 12 depicts a side view of the substrate and grounding strip of FIG. 8.
Figure 13:
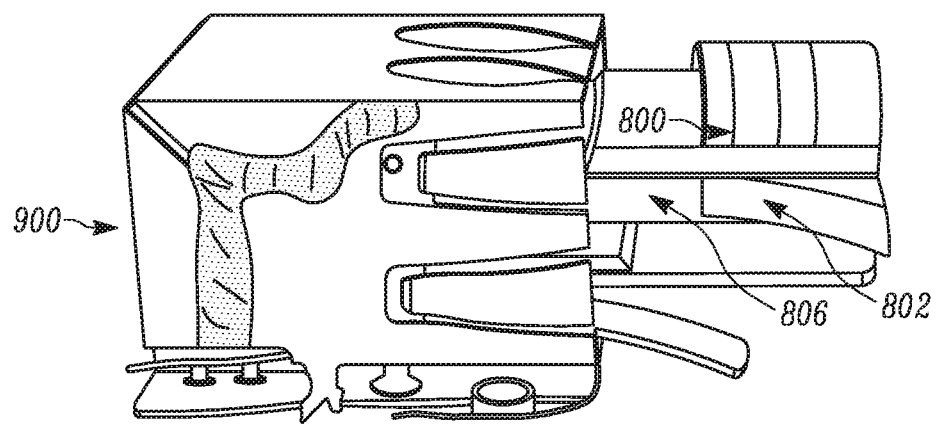
FIG. 13 depicts a side view of the plug of FIG. 8 inserted into a jack.
Figure 14:
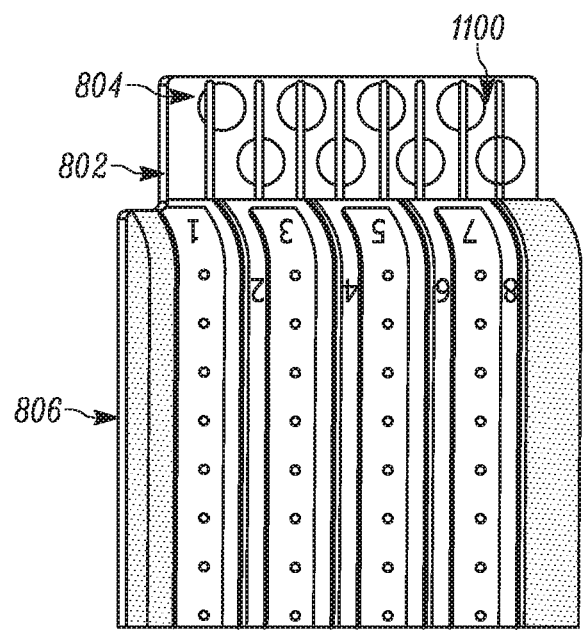
FIG. 14 depicts a top view of the substrate of FIG. 8 with connection tabs inserted into the vias.

FIG. 11 depicts a grounding strip 806 on the substrate 802 of a plug 800. Connection tabs 1100 are inserted into the vias 804 to allow for the connection of wires. The grounding strip 806 may be a thin foil made of conductive material that is wrapped around a side of the substrate 802 and a portion of the top surface and bottom surface of the substrate. FIG. 12 depicts a side view of the substrate 802 and grounding strip 806. FIG. 13 depicts a side view of the plug 800 inserted into a jack 900. FIG. 14 depicts a top view of the substrate 802 with connection tabs 1100 inserted into the vias 804.

Figure 15:
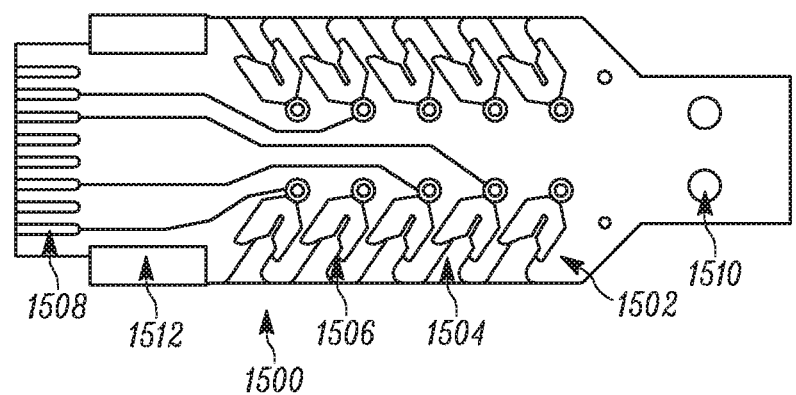
FIG. 15 depicts one embodiment of a high speed communication plug.

FIG. 15 depicts one embodiment of a high speed communication plug. The plug 1500 includes a multi-layer substrate 1502 with openings, or slots, 1504 formed in the substrate. Securing units 1506 are positioned in each opening 1504 on a top of bottom surface of the substrate 1502. A plurality of pins 1508 are positioned on an end of the substrate 1502 and two openings 1510 are formed on an end of the substrate 1502 opposite the pins 1508. Ground strips 1512 are formed on opposite sides of the substrate 1502 near the pins 1508.

Figure 16A:
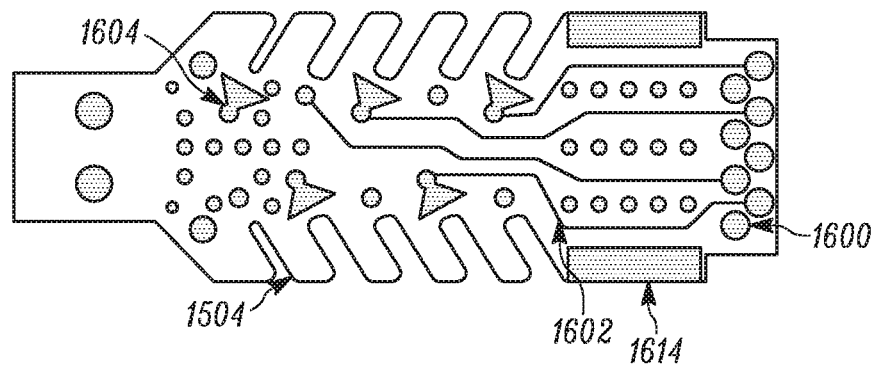
FIG. 16A depicts a top layer of the substrate of the high speed communication plug of FIG. 15.

FIG. 16A depicts a top layer of the substrate of the high speed communication plug 1500 of FIG. 15. The top layer of the substrate 1502 includes vias 1600 that are sized to accommodate pins 1508. A trace 1602 connects each via 1600 and connection pad 1604 positioned near an associated opening 1504 to a corresponding pin 1508 on an opposite end of the substrate 1502. The connection pads 1604 are identical to the connection pads in FIG. 1B. The top surface includes traces 1602 connecting a portion of the connection pads 1614 to corresponding pins 1508 and the bottom surface includes traces (not shown) for connecting the other connections pads 1614 to corresponding pins 1508 by traces. Grounding surfaces 1614 are positioned on opposite sides of the substrate 1502 near the vias 1600. The grounding surface 1614 engages the grounding strips 1512 when plug is assembled.

Figure 16B:
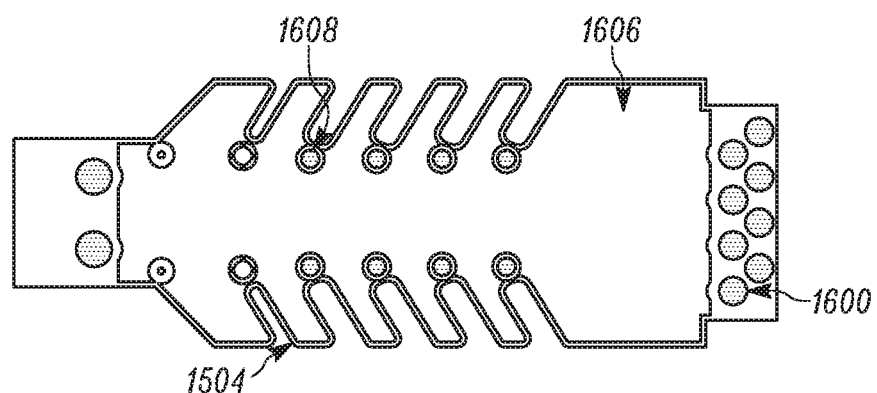
FIG. 16B depicts a sub layer of the substrate that is poisoned adjacent to the top layer.
Figure 16C:
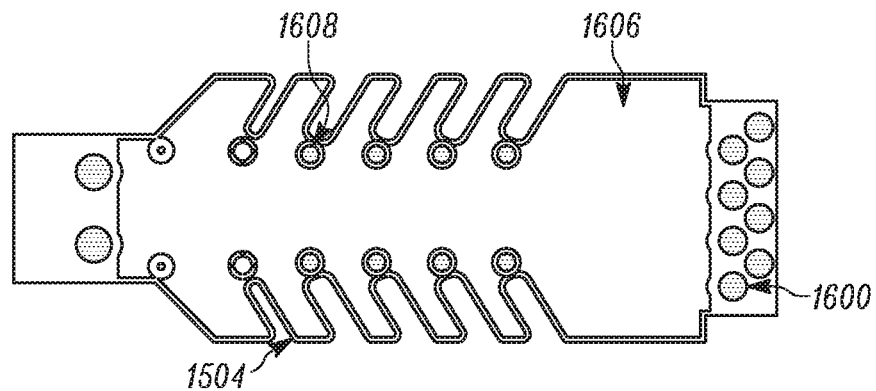
FIG. 16C depicts the bottom layer of the substrate.
Figure 16D:
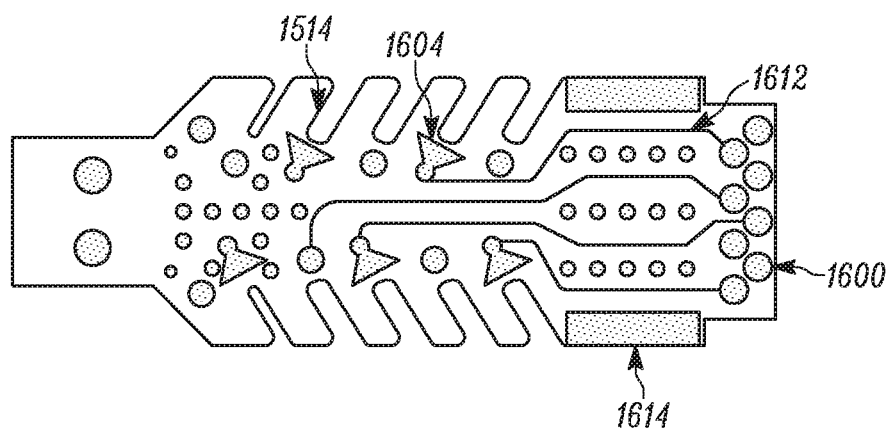

FIG. 16B depicts a sub layer of the substrate that is poisoned adjacent to the top layer. The sub layer includes a grounding plane 1606 extending from an area adjacent to the vias 1600 to an area adjacent the side of the substrate 1502 opposite the vias 1600. The grounding plane 1606 may formed of any conductive material including copper and copper alloys. Vias 1608 are positioned near each opening 1504 to connect the connection pad 1604 to the back surface of the substrate 1600. FIG. 16C depicts a middle layer of the substrate having the same configuration as the sub layer. The grounding planes 1606 in the sub layer and middle layer both include portions that are in electrical contact with the grounding surface 1614. Each of the vias 1600 and 1608 are concentrically aligned in each layer to provide a passageway from the top surface to the bottom surface of the substrate 1502.

FIG. 16C depicts the bottom layer of the substrate. The bottom layer includes vias 1608 that connect the top layer or the substrate 1502 to the bottom layer of the substrate 1502 such that pins 1508 inserted into the vias 1600 electrically connect the top surface to the bottom surface. A plurality of traces 1612 connect the vias 1600 to the connection pads 1604 on the surface of the back layer. Each connection pad 1604 on the top layer and bottom layer of the substrate 1502 is positioned over a corresponding via 1608 such that each via 1608 connects the top layer to the bottom layer. The top layer and bottom layer of the substrate 1502 include grounding surfaces 1614 positioned on an end of the substrate 1602 near the vias 1600. The grounding surfaces 1614 are electrically connected to the grounding planes 1606 in the sub layer and middle layer of the substrate 1502 to provide a connection between the grounding strips 1614 and the ground planes 1606. In one embodiment, the traces 1612 on the bottom surface are formed for vias 1600 and connection pads 1604 not connected to traces 1602 on the top layer of the substrate 1502.

Figure 17:
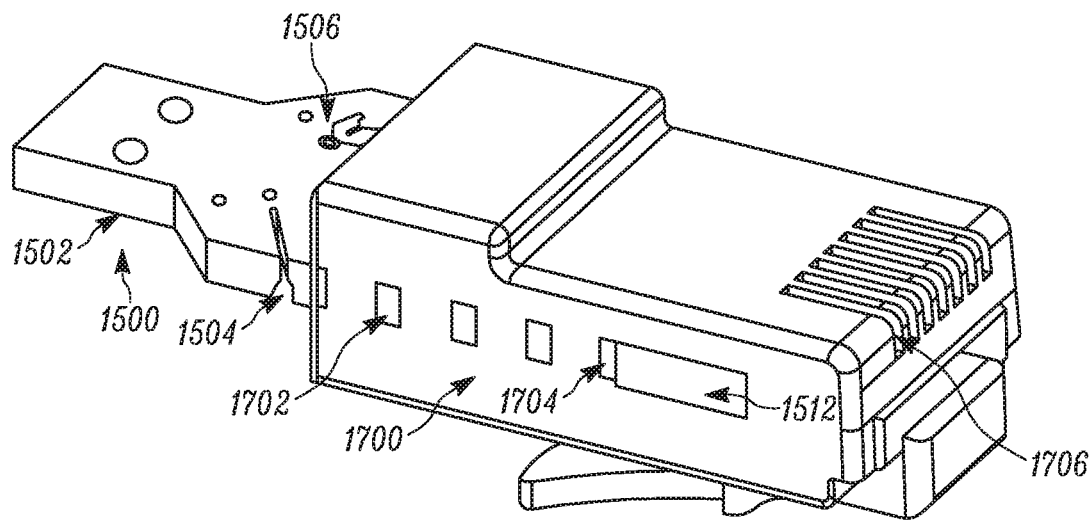
FIG. 17 depicts the substrate inserted into a plug housing.

FIG. 17 depicts the substrate inserted into a plug housing. The plug housing 1700 may be made of any known material used for making communication plugs including plastic or metal. Each side of the plug housing 1700 includes wire openings 1702 with each wire opening 1704 being aligned to an opening 1504 on the substrate. Each wire opening 1702 is sized to accommodate a solid core or stranded wire. In one embodiment, the wire is a #24 wire. In another embodiment, the wire is a #22 wire. The plug can accept any number of wires based on the size and density of the substrate. In one embodiment, the substrate accepts a single pair of wires. In another embodiment, the substrate accepts twelve pairs of wires. When a wire (not shown) is inserted into the wire opening 1702 the wire is guided by the wire opening 1702 into a securing unit 1506 positioned in the opening 1502 corresponding to the wire opening 1702 such that the wire engages the securing unit 1506 to secure the wire in the opening 1502 and to provide an electrical connection between the wire and the connection pad 604 via the securing unit 1506.

The plug housing 1700 includes grounding openings 1704 on each side of the plug with the grounding openings 1704 aligning with the grounding strips 1512 such that the grounding strips 1512 extend through the opening when the substrate 1502 is inserted into the plug housing 1700. By exposing the grounding strips 1512 through the plug housing 1700, the plug can be grounded to a high speed communication jack without any additional crimping or wiring thereby increasing the reliability of the ground connection, and reducing the labor required to install and ground the plug. The plug housing 1700 includes a plurality of pin openings 1706 one the end of the plug hosing 1700 opposite the substrate 1502 with each pin housing aligning with a pin 1508 on the substrate 1502 when the substrate 1502 is inserted into the plug housing 1700.

Figure 18:
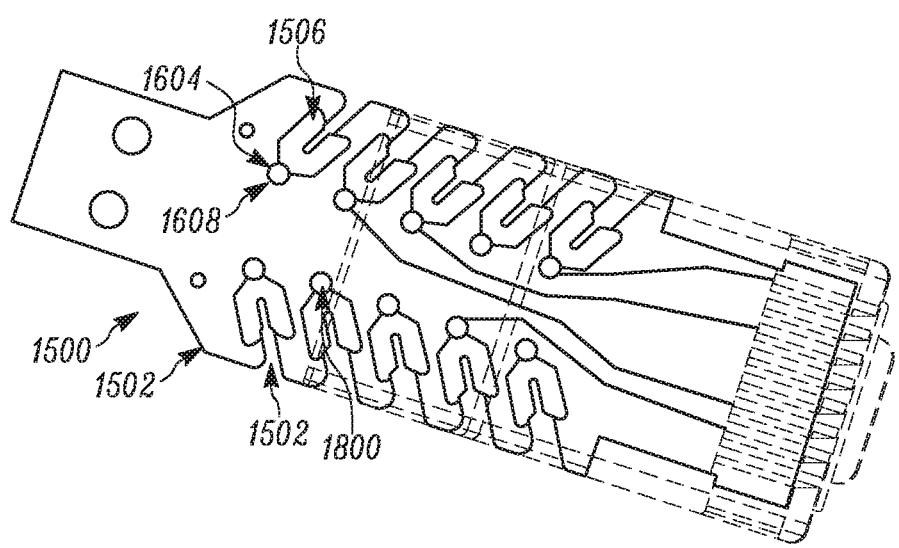
FIG. 18 depicts a view of the substrate inserted into the plug housing.

FIG. 18 depicts a view of the substrate inserted into the plug housing. The securing unit 1506 is inserted into each opening 1504 such that a pin 1800 on an end of the securing unit 1506 is inserted into the via 1608. The securing unit 1506 is positioned over a connection pad 1604 with the connection pad 1604 extending around the periphery of the via 1608. The securing units 1506 are inserted into openings 1504 on the top surface and bottom surface of the substrate 1502. The securing units 1504 may be made of any conductive material including copper and copper allows. Traces 1602 connect the each connection pads 1604 to the pins 1508. The traces 1602 may connect the pins 1800 of a securing unit 1506 to the pins 1508.

Figure 19:
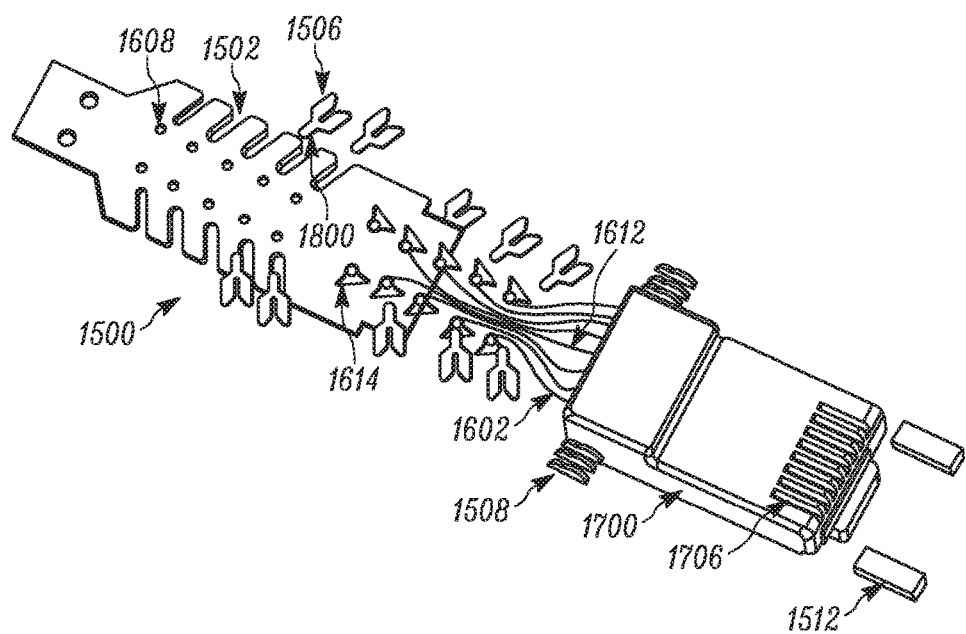
FIG. 19 depicts a break away view of the high speed communication plug.

FIG. 19 depicts a break away view of the high speed communication plug. The plug includes the substrate 1502 having a plurality of vias 1608 with each via 1608 having a connection pad 1614 extending around the periphery of the via 1608 and forming a triangular shape on the side of the via 1608 closest to the opening 1502. Securing units 1506 include pins 1800 on one end of the securing unit 1506 with each pin 1800 being sized to engage a corresponding via 1608. Each securing unit 1506 is inserted into a respective opening 1502 by inserting the pin 1800 into the via 1608 and positioning the back portion of the securing unit 1506 parallel to the surface of the substrate 1502 such that the securing unit 1506 covers the connection pad 1614. Traces 1602 and 1612 extend from each connection pad 1614 to a corresponding pin 1508 at the opposite end of the substrate 1502. By positioning traces 1602 and 1612 on both on the top surface and bottom surface of the substrate 1502, the signals transferred on the traces are better isolated thereby reducing interference. Grounding surfaces 1614 are positioned on opposite sides of the substrate 1502 near the pins 1508 and provide a grounding connection between the connection jack and the plug.

In the present disclosure, the words "a" or "an" are to be taken to include both the singular and the plural. Conversely, any reference to plural items shall, where appropriate, include the singular.

It should be understood that various changes and modifications to the presently preferred embodiments disclosed herein will be apparent to those skilled in the art. Such changes and modifications can be made without departing from the spirit and scope of the present disclosure and without diminishing its intended advantages. It is therefore intended that such changes and modifications be covered by the appended claims.

The invention claimed is:

1. A communication plug including:
   a substrate having a top surface, a bottom surface, opposing side surfaces and opposing end surfaces;
   a grounding plane in the substrate;
   a grounding strip on a side surface of the substrate in electrical communication with the grounding plane
   a plurality of vias arranged in two parallel rows on one opposing end surface and each extending through the substrate;
   a plurality of connection pads formed on the top and bottom surface near the opposite end surface of the substrate;
   a first set of traces on the top surface extending from a first row of the parallel rows of vias to a respective connection pad on the top surface;
   a second set of traces on the bottom surface extending from a second row of the parallel rows of vias to a respective connection pad on the bottom surface,
   wherein the grounding strip is electrically connected to the ground plane in the substrate.

2. The communication plug of claim 1 including a plurality of openings in the sides of the substrate.

3. The communication plug of claim 1, wherein each connection pad is formed on the top or bottom surface of the substrate around a wire via.

4. The communication plug of claim 3, wherein the connection pad includes a circular portion extending around the periphery of the wire vias and a triangular portion extending from the circular portion towards an opening in the substrate.

5. The communication plug of claim 3 including a securing unit having a portion inserted into the wire via and a portion covering the connection pad.

6. The communication plug of claim 1 including a second grounding adjacent to the grounding plane in the substrate.

7. A method of forming a communication plug including the steps of:
   forming a bottom layer of a substrate;
   forming a sub layer on the bottom layer, the sub layer including a first grounding plane;
   forming a middle layer on the grounding layer, the middle layer having a grounding plane;
   forming a top layer on the substrate;
   forming pin vias that are arranged in two parallel rows in the substrate;
   forming openings in opposing sides of the substrate;
   forming wire vias adjacent to each opening in the substrate;
   forming a connection pad surrounding each wire via;
   forming a first set of traces on the top layer of the substrate connecting a first row of the two parallel rows of vias to respective connection pads;
   forming a second set of traces on a bottom layer of the substrate connecting a second row if the two parallel rows of vias to respective connection pads;
   forming a grounding surface on opposite sides of the substrate on the top layer and bottom layer of the substrate, the grounding surface being in electrical communication with the first grounding layer and the second grounding layer.

8. The method of claim 7 including the step of inserting a pin in each pin via.

9. The method of claim 7, wherein the step of forming the connection pad includes the step of forming a circular portion extending around the periphery of the wire vias and forming a triangular portion extending from the circular portion towards an opening in the substrate.

10. The method of claim 9 wherein the step of forming the traces includes forming the traces from each pin via to a corresponding connection pad.

11. The method of claim 7 including the step of inserting the substrate into a plug housing, the plug housing having openings in side surface so of the housing that correspond to the openings formed in the substrate.

12. The method of claim 11 wherein the housing includes a plurality of openings over the pin vias, each opening being sized to accommodate a pin.

13. The method of claim 7 including the step of inserting a pin on a from portion of a securing into each wire via and positioning a lower portion of a securing unit over the connection pad corresponding to the wire via accepting the pin.

14. The method of claim 13 wherein each securing unit secures one wire in electrical communication with a connection pad.

* * * * *